United States Patent
Yates et al.

(10) Patent No.: US 7,573,121 B2
(45) Date of Patent: Aug. 11, 2009

(54) METHOD FOR ENHANCING ELECTRODE SURFACE AREA IN DRAM CELL CAPACITORS

(75) Inventors: Donald L Yates, Boise, ID (US); Garry A Mercaldi, Meridian, ID (US); James J Hofmann, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/514,694

(22) Filed: Aug. 31, 2006

(65) Prior Publication Data

US 2007/0048955 A1    Mar. 1, 2007

Related U.S. Application Data

(60) Continuation of application No. 10/408,358, filed on Apr. 7, 2003, now Pat. No. 7,148,555, which is a division of application No. 10/050,390, filed on Jan. 16, 2002, now Pat. No. 6,794,704.

(51) Int. Cl.
    *H01L 29/94* (2006.01)
(52) U.S. Cl. ............... 257/534; 257/306; 257/E21.012
(58) Field of Classification Search ............... 257/306, 257/534, E21.012
    See application file for complete search history.

(56) References Cited

U.S. PATENT DOCUMENTS 3,366,515 A * 1/1968 Fraser et al. ............... 75/229

(Continued)

FOREIGN PATENT DOCUMENTS

EP    0567748 A1    3/1993

(Continued)

OTHER PUBLICATIONS

Chan, Vanessa et al., Ordered Bicontinuous Nanoporous and Nanorelief Ceramic Films from Self Assembling Polymer Precursors, Science, Nov. 26, 1999, vol. 286, pp. 1716-1719.

(Continued)

*Primary Examiner*—Bradley K Smith
(74) *Attorney, Agent, or Firm*—Whyte Hirschboeck Dudek SC

(57) ABSTRACT

Methods for forming the lower electrode of a capacitor in a semiconductor circuit, and the capacitors formed by such methods are provided. The lower electrode is fabricated by forming a texturizing underlayer and then depositing a conductive material thereover. In one embodiment of a method of forming the lower electrode, the texturizing layer is formed by depositing a polymeric material comprising a hydrocarbon block and a silicon-containing block, over the insulative layer of a container, and then subsequently converting the polymeric film to relief or porous nanostructures by exposure to UV radiation and ozone, resulting in a textured porous or relief silicon oxycarbide film. A conductive material is then deposited over the texturizing layer resulting in a lower electrode have an upper roughened surface. In another embodiment of a method of forming the lower electrode, the texturizing underlayer is formed by depositing overlying first and second conductive metal layers and annealing the metal layers to form surface dislocations, preferably structured as a periodic network. A conductive metal is then deposited in gaseous phase, and agglomerates onto the surface dislocations of the texturizing layer, forming nanostructures in the form of island clusters. The capacitor is completed by depositing a dielectric layer over the formed lower electrode, and forming an upper capacitor electrode over the dielectric layer. The capacitors are particularly useful in fabricating DRAM cells.

18 Claims, 9 Drawing Sheets

U.S. PATENT DOCUMENTS

| | | | |
|---|---|---|---|
| 5,102,832 | A | 4/1992 | Tuttle |
| 5,407,534 | A | 4/1995 | Thakur |
| 5,418,180 | A | 5/1995 | Brown |
| 5,612,560 | A | 3/1997 | Chivukula et al. |
| 5,616,959 | A | 4/1997 | Jeng |
| 5,753,948 | A * | 5/1998 | Nguyen et al. .............. 257/307 |
| 5,789,268 | A | 8/1998 | Chivukula et al. |
| 5,815,304 | A | 9/1998 | Choi |
| 5,851,898 | A | 12/1998 | Hsia et al. |
| 5,937,294 | A | 8/1999 | Sandhu et al. |
| 5,990,559 | A | 11/1999 | Marsh |
| H1824 | H | 12/1999 | Johnsen et al. |
| 6,022,595 | A | 2/2000 | McDonald et al. |
| 6,033,967 | A | 3/2000 | Li et al. |
| 6,051,869 | A | 4/2000 | Pan et al. |
| 6,143,646 | A | 11/2000 | Wetzel |
| 6,153,899 | A | 11/2000 | Ping |
| 6,180,485 | B1 | 1/2001 | Parekh et al. |
| 6,188,097 | B1 * | 2/2001 | Derderian et al. ........... 257/306 |
| 6,190,992 | B1 | 2/2001 | Sandhu et al. |
| 6,194,264 | B1 | 2/2001 | Ping et al. |
| 6,197,634 | B1 | 3/2001 | Schuegraf |
| 6,281,543 | B1 * | 8/2001 | Al-Shareef et al. .......... 257/309 |
| 6,284,589 | B1 | 9/2001 | Lim et al. |
| 6,537,925 | B2 | 3/2003 | Kim et al. |
| 6,613,586 | B2 | 9/2003 | Bailey |
| 2001/0001210 | A1 | 5/2001 | Rhodes et al. |
| 2001/0023110 | A1 | 9/2001 | Fukuzumi et al. |
| 2002/0005536 | A1 | 1/2002 | Schindler et al. |
| 2002/0084471 | A1 | 7/2002 | Won et al. |
| 2005/0101099 | A1 | 5/2005 | Kim et al. |
| 2005/0194628 | A1 | 9/2005 | Kellar et al. |
| 2006/0263977 | A1 | 11/2006 | Kim et al. |

FOREIGN PATENT DOCUMENTS

| | | |
|---|---|---|
| JP | 04-216662 | 8/1992 |
| JP | 5-075056 | 3/1993 |
| JP | 06-020958 | 1/1994 |
| JP | 10-107026 | 4/1998 |
| JP | 11-220101 | 8/1999 |
| JP | 2000-191324 | 7/2000 |
| WO | 01/95377 A2 | 12/2001 |
| WO | 01/95378 A2 | 12/2001 |

OTHER PUBLICATIONS

Lewis, P.A. et al., Silicon Nanopillars Formed with Gold Colloidal Particle Masking, J. Vac. Sci. Technol., B 16(6), Nov./Dec. 1998, pp. 2938-2941.

Phely-Bobin et al., Preferential Self-Assembly of Surface-Modified Si/SiOx Nanoparticles on UV/Ozone Micropatterned Poly(dimethylsiloxane) Films, Adv. Mater., 2000, 12, No. 17, Sep. 1, pp. 1257-1261.

Yang, G.R. et al., Increase of Deposition Rate of Vapor Deposited Polymer by Electric Field, DUMIC Conference, 1996 ISMIC, Feb. 20-21, 1996, pp. 214-219.

Bromann, K. et al., Self-Organized Growth of Cluster Arrays, Eur. Phys. J.D., 9, 1999, pp. 25-28.

Guarini et al., Nanoscale patterning using self-assembled polymers for semiconductor applications, J. Vac. Sci Technol. B. 19(6) (Nov./Dec. 2001) 2784-2788.

Brune et al., Self-organized growth of nanostructure arrays on strain-relief patterns, Nature, 394 (Jul. 1998) 451-453.

C.L. Mirley, et al., A Room Temperature Method for the Preparation of Ultrathin SiOx Films from Langmuir-Blodgett Layers, Langmuir, vol. 11, No. 4, Apr. 1995, American Chemical Society, pp. 1049-1052.

R. Schuster, et al., Stress Relief via Island Formation of an Isotropically Strained Bimetallic Surface Layer: The Mesoscopic Morphology of the Ag/Pt (111) Surface Alloy, The Physical Society, Nov. 15, 1996, vol. 54, No. 19, pp. 13476-13479.

* cited by examiner

METHOD FOR ENHANCING ELECTRODE SURFACE AREA IN DRAM CELL CAPACITORS

CROSS REFERENCE TO RELATED APPLICATION

The present application is a continuation of U.S. patent application Ser. No. 10/408,358, filed on Apr. 7, 2003, which is a division of U.S. patent application Ser. No. 10/050,390, filed on Jan. 16, 2002, now U.S. Pat. No. 6,794,704.

FIELD OF THE INVENTION

The invention relates generally to semiconductor devices, and more particularly to semiconductor capacitor constructions and methods of forming semiconductor capacitors, particularly in applications for forming dynamic random access memory (DRAM) cell structures and integrated circuitry incorporating DRAM cell structures.

BACKGROUND OF THE INVENTION

The continuing densification and miniaturization of integrated circuits has led to smaller areas that are available for semiconductor memory devices. For example, in the fabrication of high density dynamic random access memory cells (DRAMs), there is less area available for the storage node (capacitor) of a memory cell. However, the capacitor must have a minimum storage capacitance to ensure operation of the memory cell. There is also a need for increased storage to enable devices to perform more functions at a faster rate.

Several techniques have been developed to increase the storage area of the capacitor within a limited space. For example, surface area has been increased by forming the capacitor in a trench or as a stacked structure. The surface area of the capacitor has also been achieved by increasing the surface roughness of the lower electrode that forms the storage node.

One prior art process for increasing the electrode surface area by forming a rough upper surface is illustrated in FIGS. 1A-1D, with respect to forming the lower electrode as a layer of hemispherical grain (HSG) polysilicon. Referring to FIG. 1A, a semiconductor wafer fragment 10 is shown in a preliminary processing step to form a DRAM capacitor. Wafer fragment 10 comprises a semiconductor material 12 (e.g., monocrystalline silicon) and wordlines 14, 16, having nitride spacers 18 formed laterally adjacent thereto. A diffusion region 20 within the substrate material 12 is positioned between wordlines 14, 16, and electrically connected by the transistor gates that are comprised by wordlines 14, 16. An insulative layer 22 such as borophosphosilicate glass (BPSG) has been formed over the semiconductive material 12 and the wordlines 14, 16. A doped polycrystalline plug 24 has been formed through the insulative layer 22 to provide electrical contact between the capacitor and a diffusion region 20 between wordlines 14, 16. A contact opening 26 has been formed through the insulative layer 22 to the plug 24. A thin, heavily doped and substantially amorphous or pseudo-crystalline silicon layer 28 has been deposited over the insulative layer 22 and plug 24.

Referring to FIG. 1B, according to the prior art process, an undoped amorphous or pseudo-crystalline silicon layer 30 is deposited over the doped amorphous or pseudo-crystalline silicon layer 28. The wafer fragment 10 is then exposed to a silicon source gas such as silane or disilane (arrows 32) to form a seed layer of silicon crystals or nucleation centers that are introduced into and distributed over the surface of the undoped amorphous or pseudo-crystalline silicon layer 30, as shown in FIG. 1C, to facilitate subsequent hemispherical grain growth. The wafer fragment 10 is then thermally annealed to convert the undoped amorphous or pseudo-crystalline silicon layer 30 into crystalline structures that are facilitated by the randomly distributed silicon crystals of the seed layer. The thermal treatment causes the polycrystalline silicon to agglomerate around the seed crystals and form HSG polysilicon 34, resulting in the storage node structure 36 shown in FIG. 1D. Although not shown, the DRAM cell is then completed by forming a thin cell dielectric layer over the structure, followed by the formation of a second cell plate (i.e., top electrode), typically a conductively doped polysilicon or metal-based layer.

Although the HSG polysilicon increases the surface area of the lower capacitor electrode, current HSG-type methods for increasing capacitor surface area are approaching physical limitations. A disadvantage of using HSG silicon to form a container type capacitor structure) is that morphology needed to increase surface area is a function of inexact physical conversion of conductive films. HSG silicon morphology required to gain surface area enhancements needed for next generation part types borders on over-consumed, bulbous grain formations that are structurally unsound. Current technology does not allow ordered HSG silicon formation, and unwanted patterns from temperature gradients across the wafer and from gas flow dynamics create large variability in surface area enhancement. Inexact ordering and size of converted grains can be problematic. For example, the grains of the silicon overgrow and form discontinuous and isolated islands. Further, if HSG silicon growth is too extensive and extends to the opposing sides of the container, the surface area of the capacitor plate decreases. In addition, since seeding is not instantaneous and takes a finite and prolonged amount of time, grains formed at the beginning of seeding are larger than grains formed from seeds deposited at the end of the seeding step. It would be desirable to have more precise and uniform roughness provided over the surface of the capacitor plate to increase surface area.

SUMMARY OF THE INVENTION

The present invention relates generally to semiconductor fabrication techniques and, more particularly, to the formation of a capacitor electrode.

In one aspect, the invention provides methods of forming a lower electrode structure in a capacitor of a semiconductor device. In one embodiment of the method, a texturizing layer in the form of a nanorelief or nanoporous film is formed prior to deposition of the cell conductive layer to form the lower electrode. The texturizing layer can comprise an ordered array of nanostructures and/or periodic network of surface structures having substantially uniform dimensions (e.g., height, size).

In another embodiment of the method, a polymeric material is deposited over the insulative layer of a container as a precursor that is converted to relief or porous structures upon ozonolysis and UV exposure, resulting in a textured layer comprising an insulative silicon oxycarbide film. The polymeric material comprises a hydrocarbon block and a silicon-containing block. The volume fraction of the hydrocarbon block relative to the silicon-containing block can be varied to form the nanostructures as a relief structure or a porous structure. The film is punch-etched (e.g., RIE) to clear an opening to the underlying substrate or conductive plug at the bottom of the cell for the subsequent deposition of a conductive material (e.g., polysilicon, conductive metal), resulting in a lower electrode have an upper roughened surface. After formation of the lower capacitor electrode, the structure is further processed to complete the capacitor by depositing a dielectric layer and forming an upper capacitor electrode over the dielectric layer. The capacitor can usefully be integrated into a DRAM cell.

In another embodiment of a method of the invention, a texturizing underlayer is fabricated from a conductive material prior to depositing a conductive layer to form the lower electrode. In forming the texturizing underlayer, a first conductive metal is deposited over the insulative layer of a container, a second dissimilar conductive metal is deposited over the first metal layer, and the two metal layers are annealed resulting in a textured layer comprising surface dislocations in a strain relief pattern, which is preferably a periodic and ordered array of nanostructures. A conductive metal is then deposited in gas phase over the texturizing layer whereby the depositing metal agglomerates onto the surface dislocations forming island clusters. Preferably, the surface dislocations of the texturizing layer are formed as a periodic network, and the overlying conductive layer comprises ordered arrays of metal island clusters. The capacitor can then be completed by depositing a dielectric layer and forming an upper capacitor electrode over the dielectric layer. The capacitor can likewise be integrated into a DRAM cell.

In another aspect, the invention provides a capacitor. The capacitors can be incorporated into a semiconductor circuit, including a circuit comprising a DRAM cell. In one embodiment, the capacitor comprises a lower capacitor plate comprising a conductive layer (e.g., polysilicon, conductive metal) overlying a texturizing layer that comprises, for example, silicon oxycarbide ceramic nanostructures, a dielectric layer overlying the lower capacitor plate, and an upper capacitor plate overlying the dielectric layer. The nanostructures of the texturizing layer can be formed by ultraviolet irradiation and ozonolysis of a polymeric material comprising a hydrocarbon block and a silicon-containing block. The nanostructures can be provided as pores or relief structures such as struts by varying, for example, the volume fraction of the hydrocarbon block relative to the silicon-containing block of the polymeric material.

In another embodiment, the capacitor comprises a lower capacitor electrode comprising a conductive metal layer overlying a conductive metal texturizing layer, a dielectric layer overlying the lower (bottom) electrode, and an upper electrode (e.g., polysilicon, conductive metal) overlying the dielectric layer. The texturizing layer comprises surface dislocations comprising a conductive metal that are formed by annealing overlying layers of a first and second conductive metal. A conductive metal layer is formed from a gaseous deposit of a conductive metal that agglomerates into clusters on the surface dislocations of the texturizing layer. Preferably, the texturizing layer comprises a periodic network of the surface dislocations, and the overlying conductive layer comprises ordered arrays of metal island structures.

In another aspect, the invention provides an integrated circuit (IC) device that incorporates either of the foregoing capacitors. The IC device can comprise, for example, an array of memory cells, internal circuitry, and at least one capacitor formed in a container and in electrical contact with an active area within a semiconductive substrate of the memory cell array. In one embodiment, the capacitor comprises a lower capacitor plate comprising a conductive layer overlying a texturizing layer comprising nanostructures composed of a polymeric silicon-comprising ceramic formed by UV irradiation and ozonolysis of a polymeric material comprising a hydrocarbon block and a silicon-containing block. In another embodiment of an IC device, the lower capacitor electrode of the capacitor can comprise a texturizing underlayer comprising surface dislocations formed from an annealed layer of two overlying and dissimilar conductive metal layers, and an overlying conductive layer comprising agglomerated island clusters of a conductive metal formed from the gaseous deposit of the conductive metal onto the surface dislocations of the texturizing layer.

Advantageously, the methods of the present invention eliminate the need for random seeding and thermal process conversion as required with respect to an HSG seed layer formation, and provides a greater level of control over topography ordering of the underlayer of a lower capacitor electrode. Unlike prior art methods of forming a capacitor using HSG silicon formation, the texture of the capacitor resulting from the present process is not a randomly created feature, and has a generally uniform pattern and height. Consequently, the size of the capacitor can be more definitively designed and engineered, which facilitates the fabrication of the memory cell. In addition, with the present methods, morphology needed to increase surface area is not a function of the physical conversion of a conductive film as in the case of HSG silicon films, and allows simple deposition of conformal conductive layers over a pre-existing topography. In addition, the temperatures required for HSG silicon deposition and thermal conversion are higher than any back end-of-line materials (metals) can tolerate, which limits formation of the capacitor to before such low temperature materials are deposited. The present processes can create ordered roughness at low temperatures and therefore have the advantage of allowing the capacitor to be formed anywhere in the process flow.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

A first embodiment of a method according to the invention is described with reference to FIGS. 2A through 2H, in a method of forming a lower electrode in a capacitor of a DRAM cell.

Figure 1A:
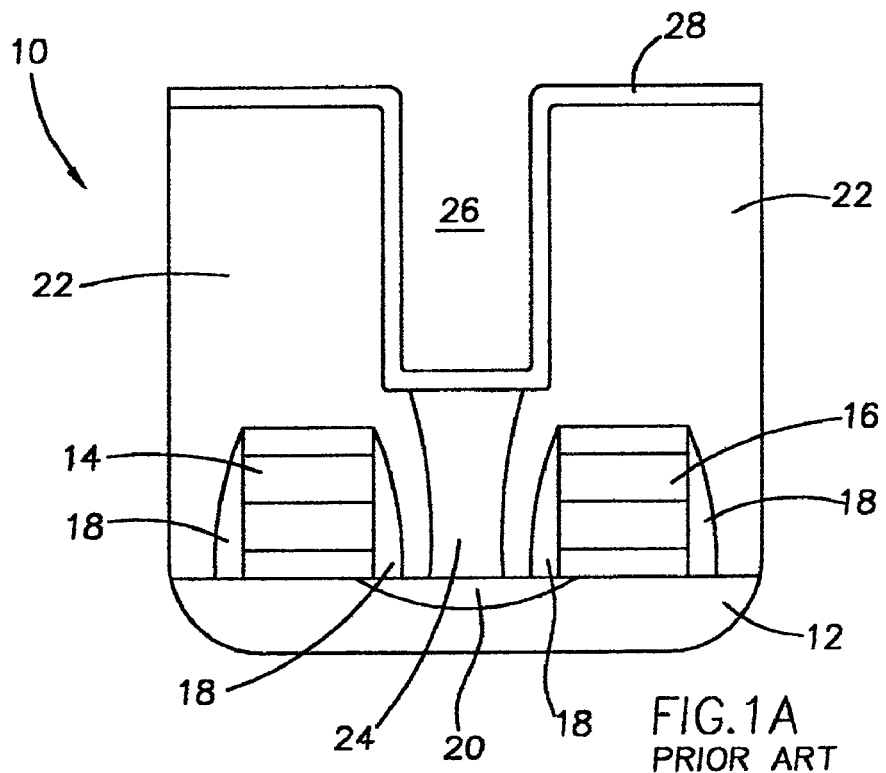
FIG. 1A is a diagrammatic cross-sectional view of a semiconductor wafer at a preliminary step of a processing sequence according to a prior art method of forming a capacitor electrode.
Figure 1B:
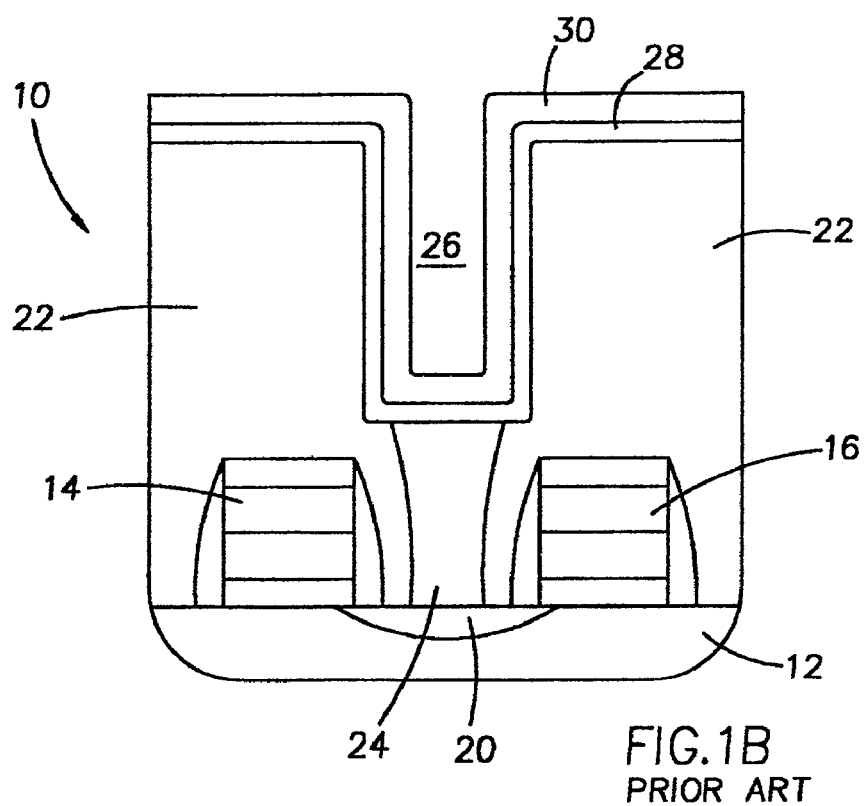
FIGS. 1B-1D are views of the wafer fragment of FIG. 1A at subsequent and sequential processing steps, showing fabrication of a capacitor electrode according to a prior art process.
Figure 1C:
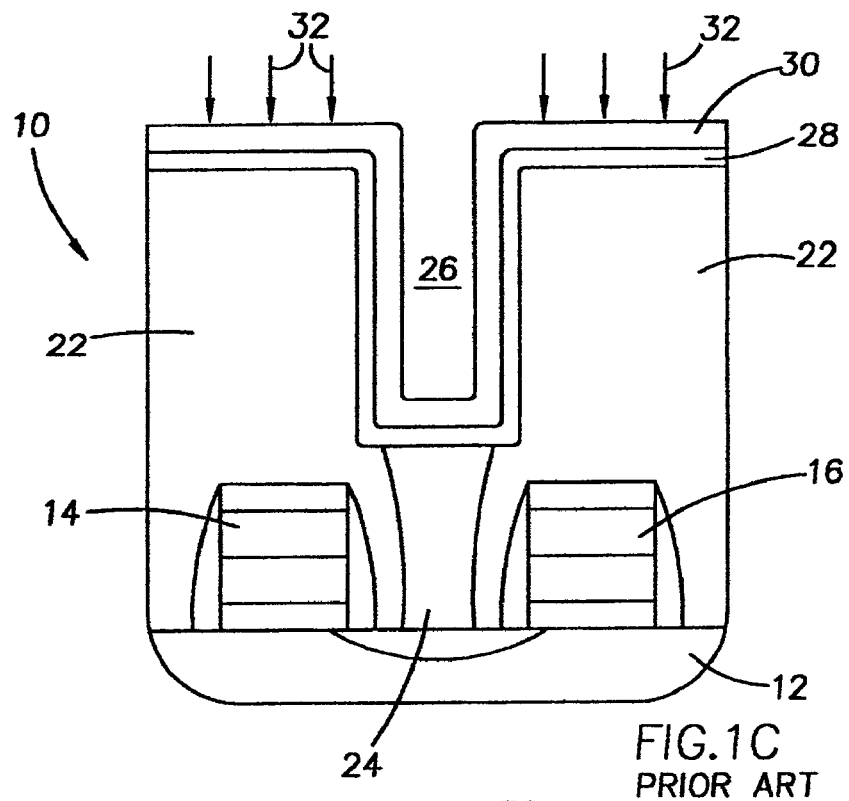
Figure 1D:
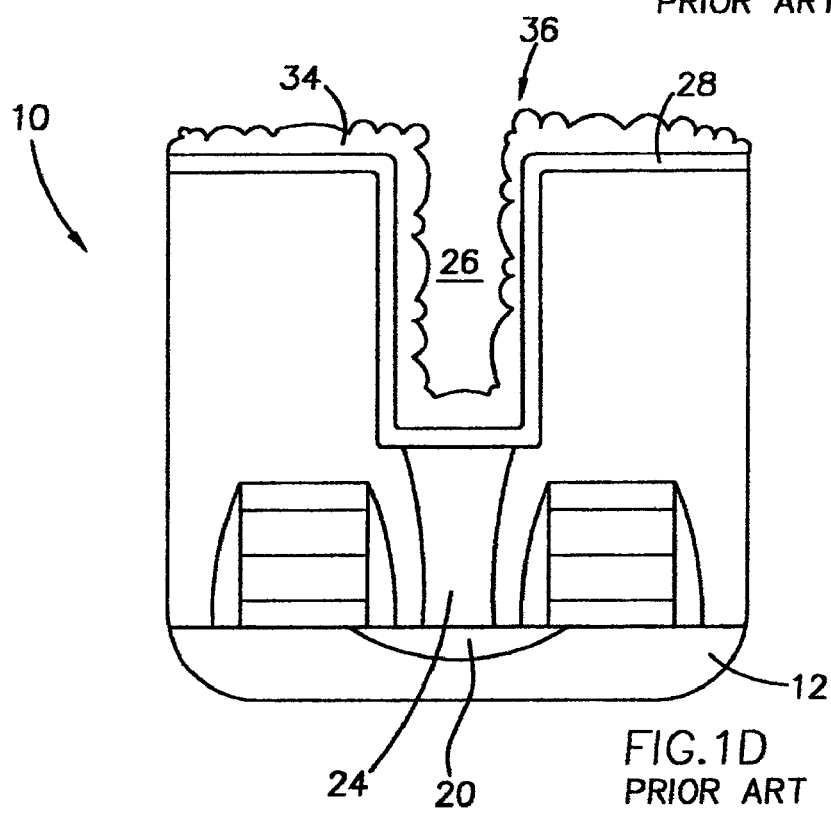
Figure 2A:
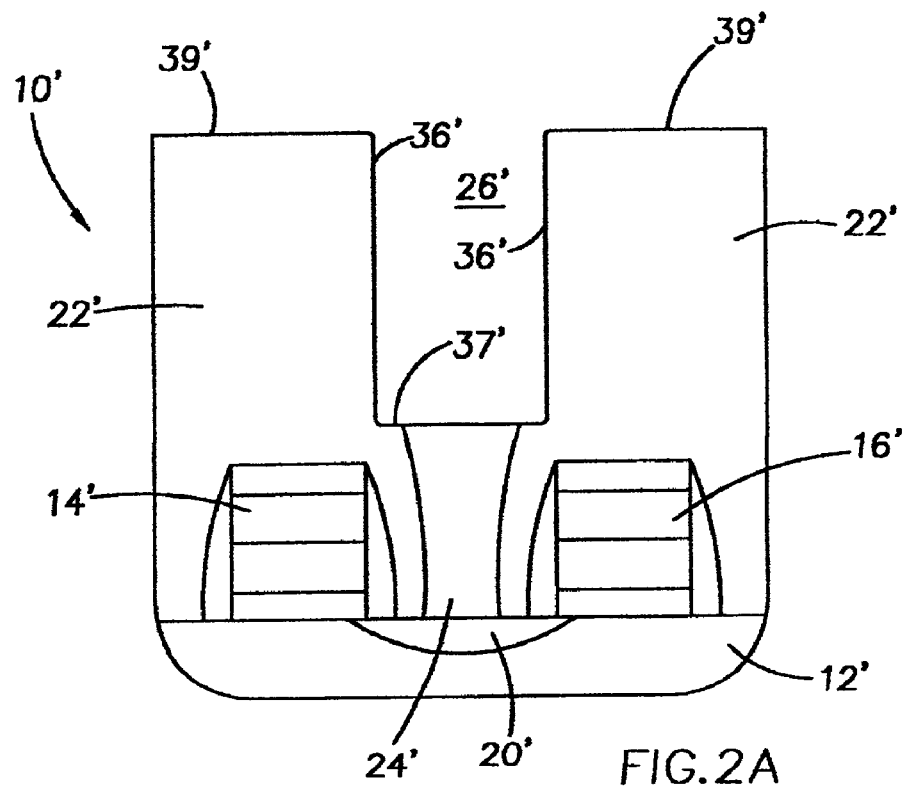
FIG. 2A is a diagrammatic cross-sectional view of a semiconductor wafer at a preliminary step of a processing sequence.

Referring to FIG. 2A, a wafer fragment 10' is shown at a preliminary processing step in the formation of a capacitor. The wafer fragment 10' in progress can comprise a semiconductor wafer substrate or the wafer along with various process layers formed thereon, including one or more semiconductor layers or other formations, and active or operable portions of semiconductor devices.

The wafer fragment 10' comprises a substrate 12' such as monocrystalline silicon, wordlines 14', 16', and a diffusion region (active area) 20'' formed in the substrate 12' between the wordlines, the diffusion region being in the form of a source/drain region. A layer 22' of BPSG or other suitable insulative material has been deposited over the substrate 12' and the wordlines 14', 16'. A plug 24' comprising doped polycrystalline, has been deposited into an opening through the insulative layer 22' as an electrical contact between the capacitor 52' and the diffusion region 20'. The foregoing structures can be formed by conventional methods known and used in the art. A container or opening 26' with sidewalls 36' and a bottom portion 37', has been conventionally etched into the insulative layer 22' to expose the plug 24'.

Figure 2B:
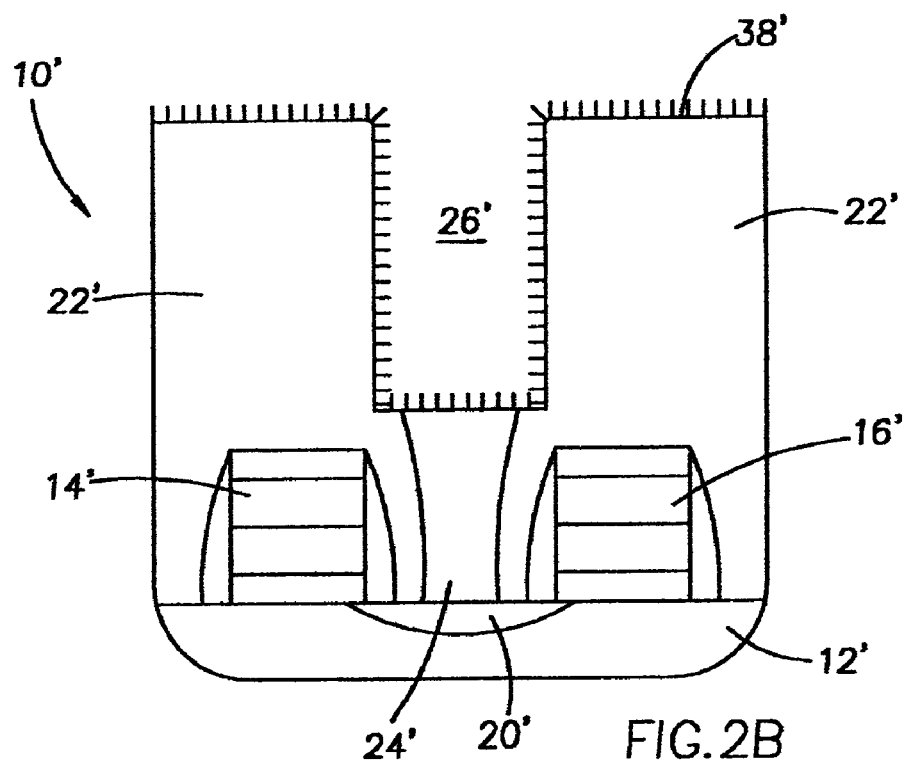
FIGS. 2B-2H are views of the wafer fragment of FIG. 2A at subsequent and sequential processing steps, showing fabrication of a capacitor electrode according to an embodiment of a method of the invention.

According to this embodiment of the method, three-dimensional ceramic nanostructured films comprising an insulative silicon oxycarbide ceramic, are formed as a texturizing layer 38' over the insulative layer 22', as depicted in FIG. 2B, to increase the surface area of the subsequently deposited conductive layer 40'. Such structures are described, for example, in Chan et al., Science 286: 1716-1719 (1999), and Phely-Bobin et al., Adv. Mater. 12(17):1257-1261 (2000).

The structure and topography of the texturizing layer 38' can be varied according to the polymeric materials, concentrations and processing parameters that are employed in forming the texturizing layer. More particularly, the texturizing layer 38' can be engineered to provide different nanostructures as desired, in the form of pores or relief structures such as struts, gyroids, among others, by varying, for example, the polymer material, the copolymer concentrations, and the parameters used for curing the deposited polymeric layer. In addition, a range of pore sizes and specific areas can be obtained by varying the molecular weight of the copolymers/polymeric material. The resulting texturizing layer comprises a high density of nanostructures generally having a uniform height and cross-dimensions. Preferably, the resulting nanostructures are highly ordered with a periodicity in three dimensions.

The polymeric material comprises a hydrocarbon block and a silicon-containing block. An example of a polymeric material for forming the nanostructures of the texturizing layer 38' comprises silicon-containing triblock copolymers of the type $A_1BA_2$, where the "A" copolymer is a hydrocarbon block such as polyisoprene, and the "B" copolymer is a silicon-containing block such as poly(pentamethyldisilylstyrene) (poly(PMDSS)). Such polymeric material is described in the aforementioned article by Chan et al. (1999). Other useful polymeric materials include poly(dimethylsiloxane), as described in the article by Phely-Bobin et al. (2000), and parylenes such as parylene-N (PA-N) and PA-F, polytetrafluoroethylene (Teflon), and polynapthalene.

The texturizing layer can be fabricated as either a porous or relief structure, by varying the volume fraction of the hydrocarbon block relative to the silicon-containing block in the block copolymer precursor. For example, a 24/100/26 (kg/mol) triblock polymer ($A_1BA_2$) composition can be used to form a double gyroid morphology of hydrocarbon block (e.g., polyisoprene) networks in a matrix of silicon-containing blocks (e.g., poly(PMDSS)), and subsequently cured to form a nanoporous structure. By way of comparison, a 44/168/112 (kg/mol) triblock polymer ($A_1BA_2$) composition can be used to form an inverse double gyroid morphology of silicon-containing block (e.g., poly(PMDSS)) networks in a matrix of hydrocarbon block (e.g., polyisoprene), which can be converted into a nanorelief structure.

To form the texturizing layer 38', the polymeric material is deposited onto the insulative layer 22', including the sidewalls 36' of the container 26', and over the plug 24'. The polymeric material can be deposited by conventional methods known and used in the art including, for example, vapor deposition polymerization (VDP), a spin-on process, or Langmuir-Blodgett (L-B) technique. The polymeric layer is then exposed to ultraviolet (UV) radiation and ozone ($O_3$), resulting in relief or porous nanostructures that form the texturizing layer 38', being in the form of struts in the illustrated embodiment (FIG. 2B).

In one method, the polymeric material can be deposited onto the insulative layer 22' by vapor deposition polymerization (VDP), as conventionally known and used in the art. Briefly, a conventional VDP can be performed by heating a source material or precursor to vaporize the molecules, decomposing the vapor into monomers by pyrolysis at an elevated temperature, and then condensing and polymerizing the monomers on a substrate in a deposition chamber. For example, a parylene-N (PA-N) film can be deposited by VDP by heating powder di-p-xylylene (dimer) to about 150° C. to vaporize the molecules, decomposing the vapor into monomers by pyrolysis at a temperature of about 650° C., and then depositing the monomers onto a silicon substrate at room temperature and a low deposition rate of about 50-70 angstroms per minute at 50 mTorr.

A polymer film can also be deposited by field enhanced vapor deposition polymerization (FEVDP), as described, for example, in U.S. Pat. No. 6,022,595 (McDonald et al.), the disclosure of which is incorporated by reference herein. In a FEVDP, an electric field is used to enhance the rate of vapor deposition polymerization of a polymer film onto a substrate. Briefly, the substrate is connected to a voltage source to form one of two electrodes of a parallel plate capacitor, and the capacitor is placed in a vacuum chamber where parameters such as pressure and temperature are maintained at predetermined levels. Gaseous monomers of the desired polymer film to be deposited, are supplied to the chamber and permitted to flow between the electrodes or plates of the capacitor. Examples of such polymers useful in the invention include parylenes such as PA-N and PA-F, Teflon (i.e., polytetrafluoroethylene), and polynapthalene. Sufficient voltage is applied to the electrodes to generate an electric field therebetween that serves to polarize the monomers without breaking their chemical bonds, and the polarized monomers react to form a polymer film on the wafer. The wafers can be rotated to enhance thickness uniformity during the deposition.

In an example of deposition of a polymer film by FEVDP, exemplary deposition conditions of a poly-p-xylylene (PA-N) film onto a silicon substrate are as follows: about 120-150° C. precursor temperature, about 650° C. reaction temperature, about 25° C. substrate temperature, about 50 mTorr deposition pressure, about 50 minutes deposition time, and a field strength of 0-600 V/cm, using a parallel plate capacitor. The electric field is applied when the chamber starts to increase its pressure beyond the base pressure.

The polymeric material can also be deposited by a spin-on technique whereby a solution of the polymeric material is spin-coated onto the insulative layer 22' using conventional equipment and processing steps. In such an application, a free-standing post-type capacitor would be constructed. Exemplary parameters for the spin-on deposition include a wafer rotation of about 500 rpm to 5,000 rpm, and a solution comprising about 4 to about 6 weight-% polymeric material in an organic solvent such as toluene or chloroform.

The polymeric material can also be deposited using a conventional Langmuir-Blodgett (LB) deposition process in which the polymeric material is suspended on a water surface and transferred as a film onto the surface of the insulating layer using a vertical transfer method whereby the wafer is submerged and then raised through the air/water interface.

After deposition, the polymeric film layer is simultaneously exposed to a flowing ozone atmosphere (2%) and ultraviolet (UV) light (preferably 254 nm) at room temperature for a suitable time period, for example, about 60 to about 90 minutes. Exposure to an oxidizing environment (ozone and UV light, or an oxygen plasma) results in the selective removal of the hydrocarbon block portions and the conversion of the silicon-containing block to silicon oxycarbide ceramic nanostructures, resulting in the texturizing layer 38'. As illustrated in FIG. 2B, the texturizing layer is in the form of struts. The relative volume fraction of the hydrocarbon block to the silicon-containing block can alter whether a nanoporous or nanorelief structure results.

Figure 2C:
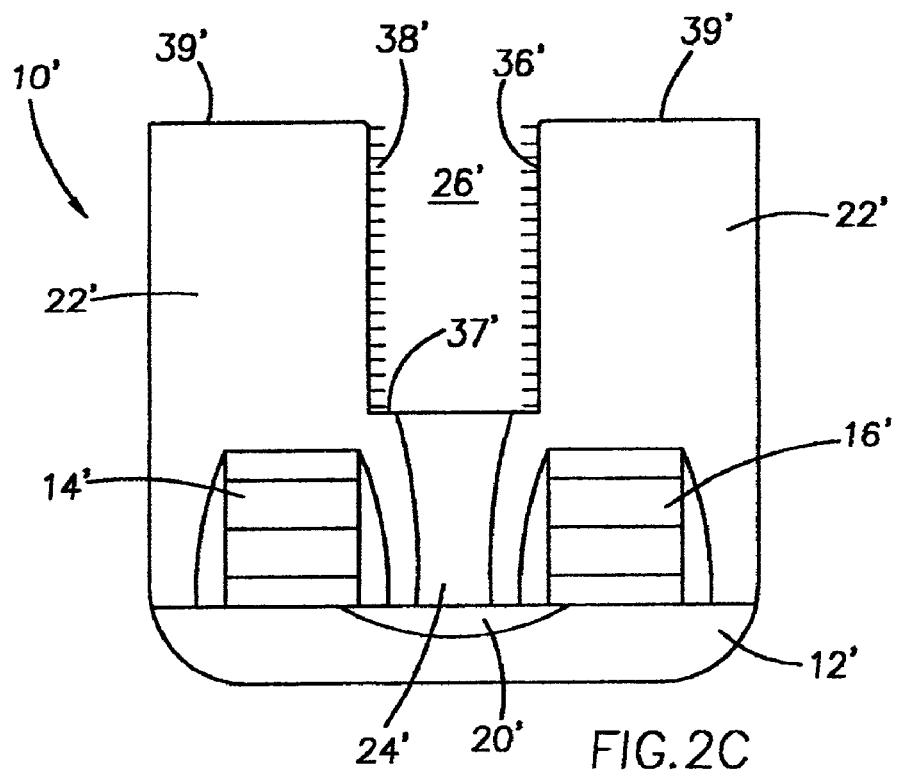

As shown in FIG. 2C, a portion of the insulative texturizing layer 38' is removed to clear the bottom 37' of the container 26' overlying the plug 24' in order that the subsequently deposited conductive film is in electrical contact with the plug 24'. This ensures a conductive path from the diffusion region 20' in the substrate 12', through the plug 24', and to the subsequently formed lower electrode 42'. The texturizing layer 38' can be removed, for example, by a punch etch using a conventional dry etch process such as a reactive ion etch (RIE) or sputter etch, which would remove material from the horizontal surfaces, including the bottom 37' of the cell and the horizontal wafer surface 39', leaving the textured film remaining on the cell sidewalls 36'.

Figure 2D:
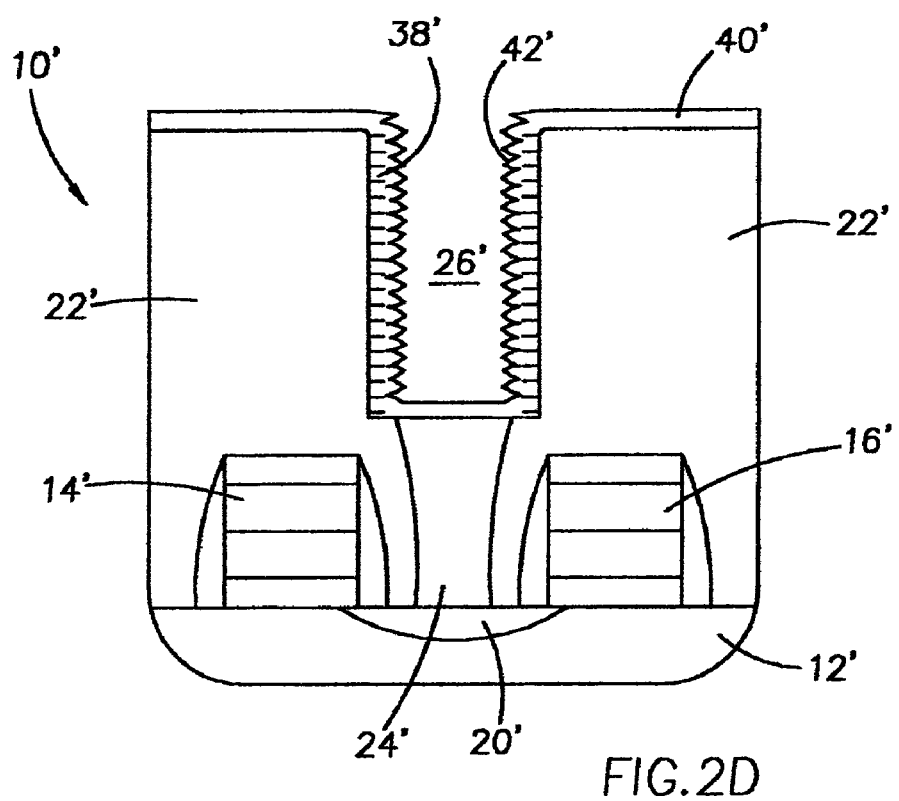

Referring now to FIG. 2D, a conductive layer 40' is deposited conformally onto the wafer over the texturizing layer 38' and onto plug 24' to form the lower electrode 42'. Exemplary conductive materials include doped amorphous, polycrystalline, and pseudo-crystalline silicon, or a conductive metal such as tungsten, platinum, titanium, ruthenium (Ru), rhodium (Rh), tantalum (Ta), and other like elements and alloys thereof, being polysilicon in the illustrated embodiment. The conductive material can be deposited using conventional methods, such as chemical vapor deposition (CVD), or physical vapor deposition (e.g., sputtering) for a conductive metal. The texture of the conductive layer 40' is generally predictable based upon the structure and topography of the underlying texturizing layer. Preferably, the conductive layer 40' has a texture that has a generally regular pattern and uniform height.

Figure 2E:
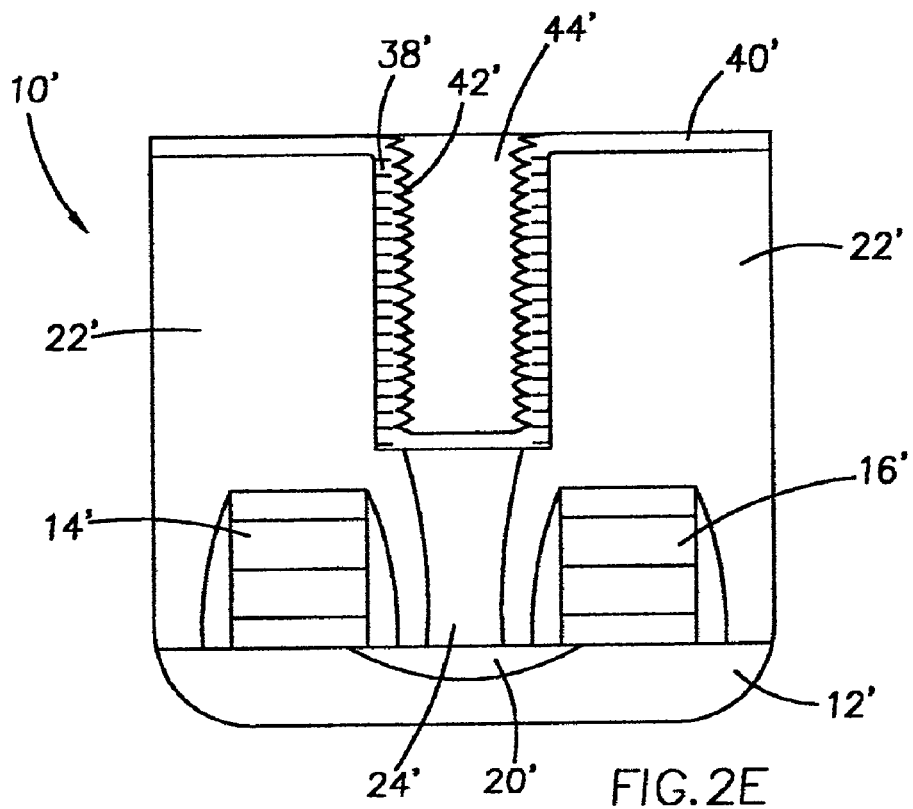

Referring to FIG. 2E, a barrier layer 44' is preferably deposited to fill the container 26', in order to prevent the slurry of a subsequent polishing step from passing into the cell opening and contaminating the cell. An exemplary barrier layer 44' comprises a resist material, such as a novolak polymer resin.

Figure 2F:
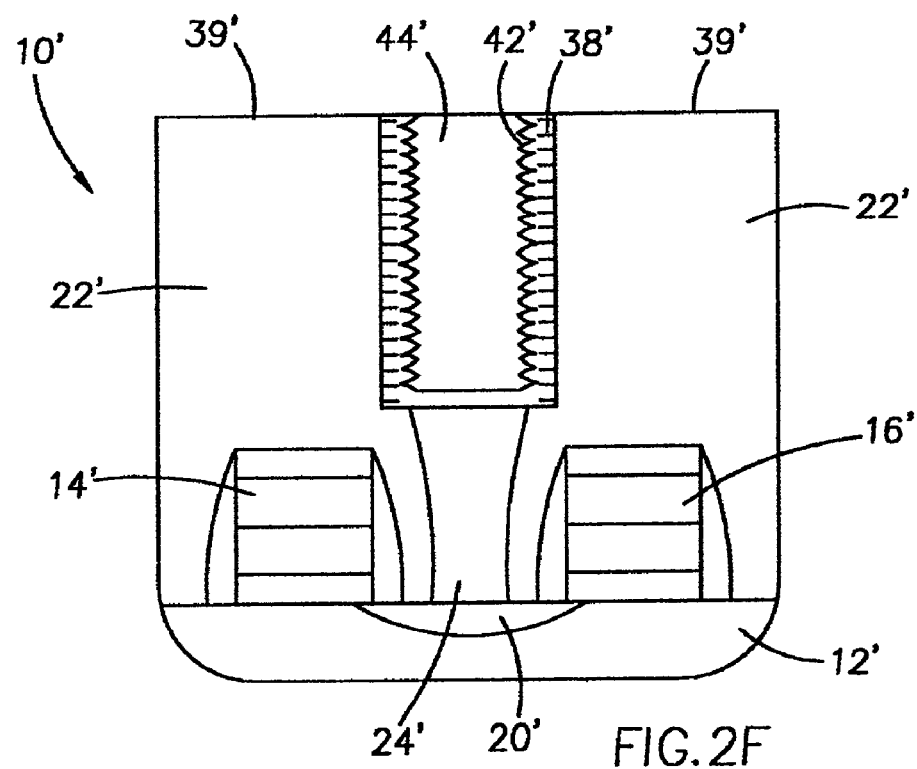

As shown in FIG. 2F, the wafer fragment 10' is then planarized to remove the conductive layer 40' from horizontal surfaces 39' of the insulative layer 22'. Such planarization can be accomplished for example, by a conventional chemical-mechanical polishing (CMP) process.

Figure 2G:
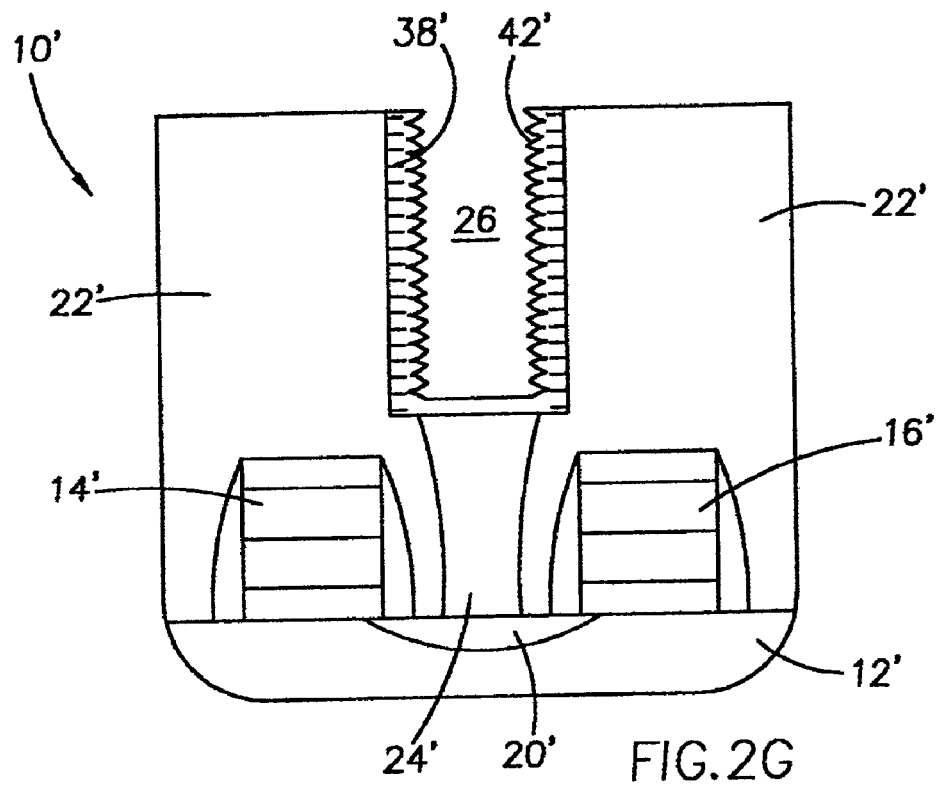

The barrier layer (e.g., resist) 44' is then removed from the container 26' using a conventional process, resulting in the lower electrode 42' shown in FIG. 2G. An exemplary resist removal process for non-metallic (silicon) capacitor constructions is a piranha wet etch whereby the wafer is immersed in a solution of sulfuric acid ($H_2SO_4$) and an oxidant such as hydrogen peroxide ($H_2O_2$). For metal capacitor constructions, organic solvents such as ST22 and ST26 (ATMI, Inc., Danbury, Conn.) and ALEG 820 (Mallinckrodt Baker, NJ) can be used for resist stripping.

Subsequent process steps are performed using techniques well known to one skilled in the art. The wafer fragment 10' is subjected to a hydrofluoric acid (HF) clean to remove native oxide that may have formed over the lower (bottom) electrode 42', for example, by immersing the wafer in an HF solution or by HF vapor treatment, according to conventional methods known in the art.

Figure 2H:
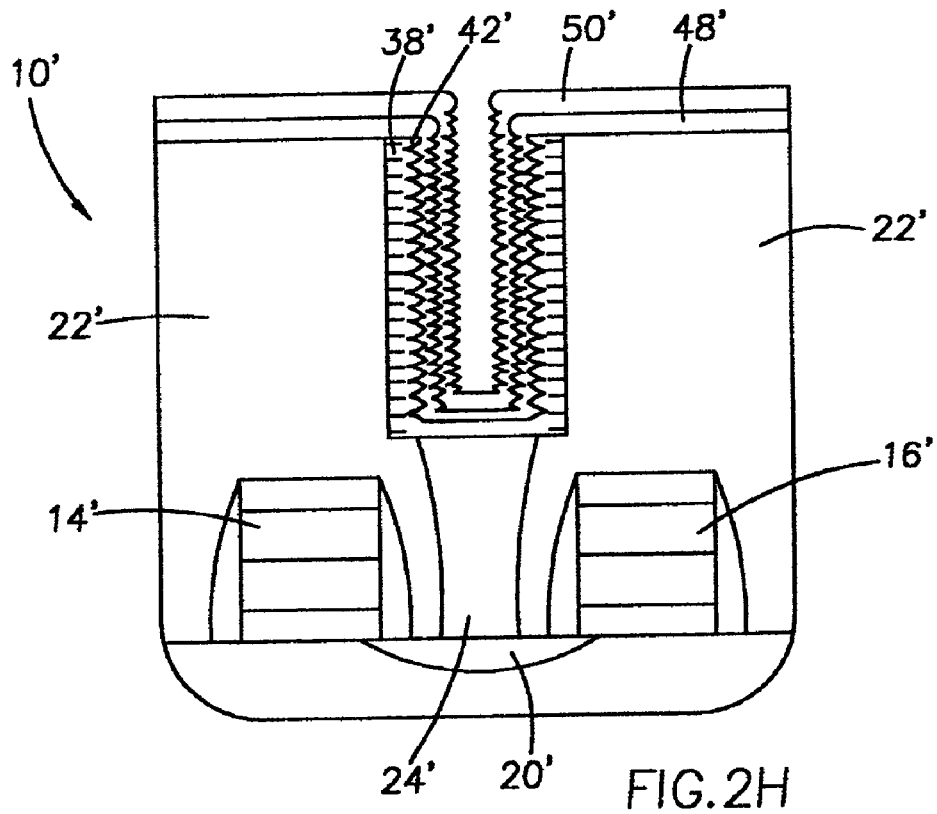

Referring to FIG. 2H, a thin dielectric layer 48' is conformally deposited over the rough surface of the lower electrode 42', typically by CVD. For silicon capacitors, the dielectric layer 48' will typically comprise silicon nitride ($Si_3N_4$). For metal capacitors, an exemplary dielectric layer 48' is tantalum pentoxide ($Ta_2O_5$). A conductive material is then deposited over the dielectric layer 48' to form the top (upper) capacitor plate electrode 50'. The top electrode 50' comprises a conductive material such as doped polysilicon or a conductive metal. The conductive material can be deposited on the dielectric layer 48' by conventional methods, such as CVD, or physical vapor deposition (e.g., sputtering) for a metal plate, to complete the capacitor structure 52'.

Figure 3A:
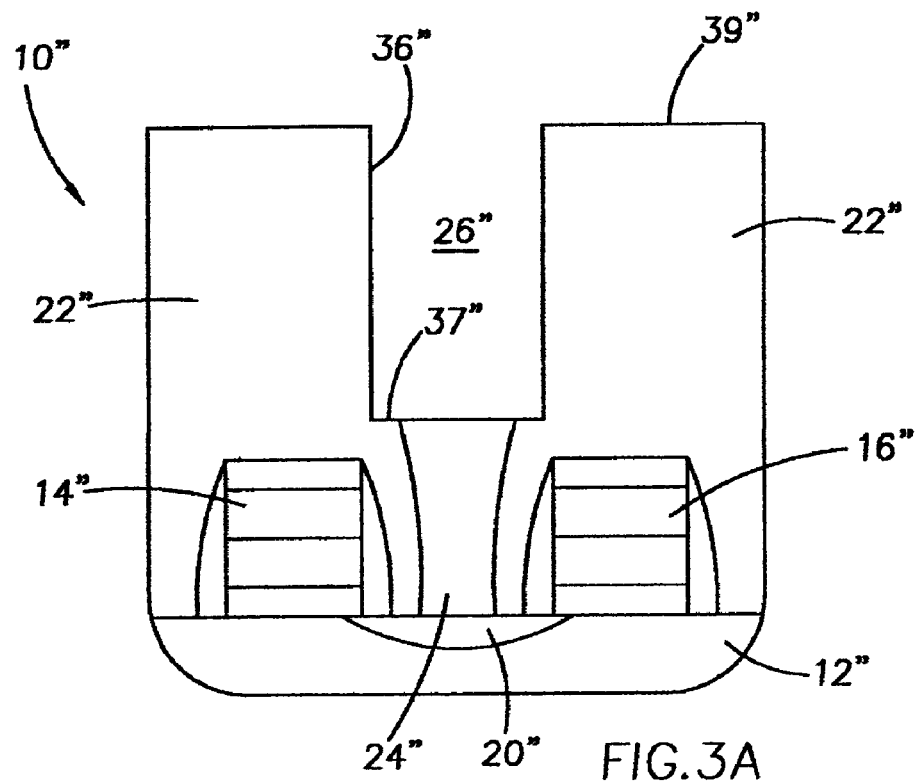
FIG. 3A is a diagrammatic cross-sectional view of a semiconductor wafer at a preliminary step of a processing sequence.

Referring now to FIGS. 3A through 3F, a second embodiment of a method of the invention is described with reference to forming a lower electrode 42" in a capacitor 52". Referring to FIG. 3A, a wafer fragment 10", similar to the wafer fragment 10', is shown at a preliminary processing step. The wafer fragment 10" comprises a substrate 12", wordlines 14", 16", a diffusion region 20", an insulative layer 22", plug 24", and a container 26".

Figure 3B:
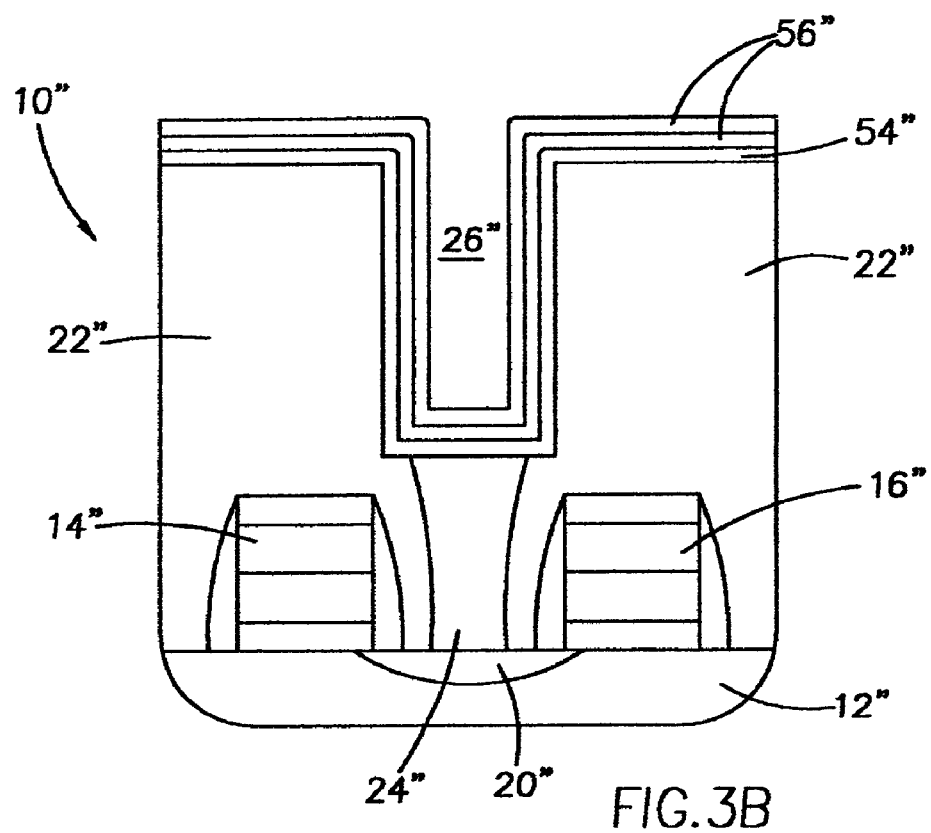
FIGS. 3B-3F are views of the wafer fragment of FIG. 3A at subsequent and sequential processing steps, showing fabrication of a capacitor electrode according to another embodiment of a method of the invention.

Referring to FIG. 3B, a first conductive metal is conformally deposited onto the insulative layer 22" to form an underlayer 54", the first conductive metal being platinum (Pt) in the illustrated example. The first conductive metal can be deposited using conventional methods, such as by chemical vapor deposition (CVD), or physical vapor deposition (e.g., sputtering).

A texturizing layer 38" is then formed by depositing successive monolayers 56" of a second conductive metal that is dissimilar to the first conductive metal over the underlayer 54", the second conductive metal being silver (Ag) in the illustrated example. Two monolayers 56" of silver are depicted in the example shown in FIG. 3B. The second conductive metal can be deposited using conventional methods, such as chemical vapor deposition (CVD), evaporation (Knudsen cell), or physical vapor deposition (e.g., sputtering). Silver (Ag) monolayers are preferably deposited at a temperature of about 400K.

Figure 3C:
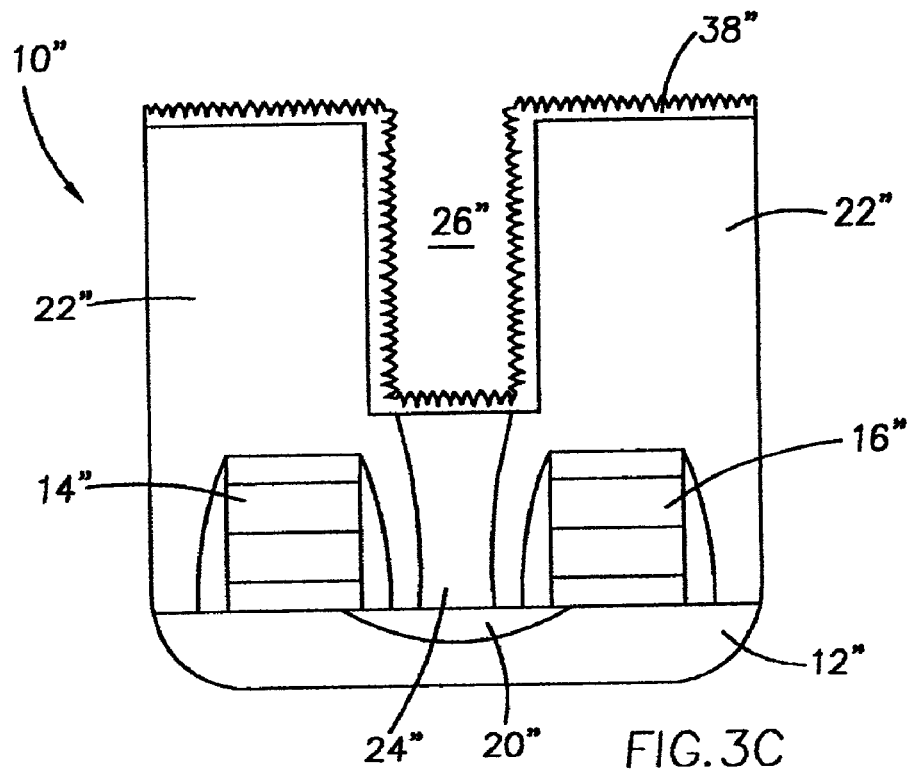

The Ag and Pt metal layers are then annealed to a temperature of about 800K, resulting in the texturizing layer 38", as depicted in FIG. 3C. During the anneal, the Ag atoms attempt to align with the underlying Pt atoms. The anneal results in lattice mismatching between the Pt underlayer 54" and the Ag overlayers 56", resulting in a compressive strain that forces the Ag atoms to form a largely symmetrical strain relief pattern or lattice over the Pt layer 54". The strain relief pattern that is formed can be, for example, a trigonal dislocation network comprising a plurality of unit cells The texturizing layer 38' preferably comprises a periodic network of surface dislocations as ordered arrays of two-dimensional structures. Such a structure is described, for example, in Bromann et al., *Eur. Phys. J.D.* 9:25-28 (1999).

Figure 3D:
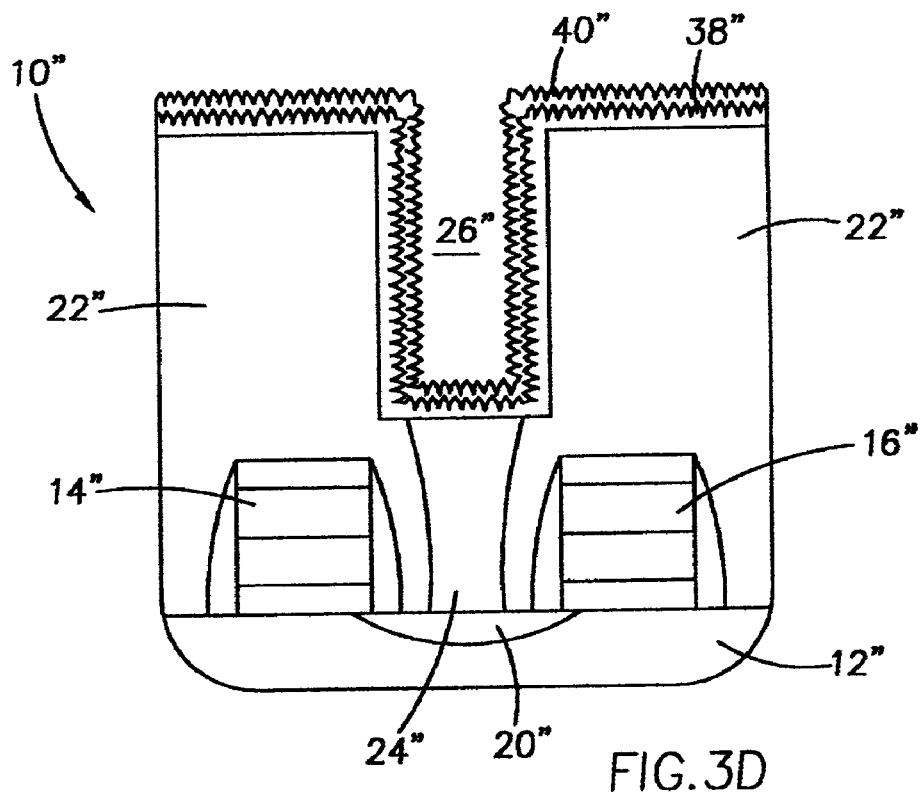

Referring to FIG. 3D, once the texturizing layer 38" is formed, a layer 40" of a conductive metal, being silver in the illustrated example, can then be deposited in gas phase onto the texturizing layer 38" to form the lower electrode 42". The conductive metal is deposited in a gaseous form according to conventional methods, preferably by an evaporation technique.

The repulsive forces of the dislocation (relief) structures or nanostructures of the texturizing layer 38" causes the depositing metal to agglomerate and form island clusters. The island formations of the conductive metal layer 40" increase the surface area of the entire capacitor structure which is useful for increased capacitance. The resulting conductive layer 40" comprises generally equally spaced structures comprising a conductive metal. It is preferred that gaseous silver is deposited at a low temperature of about 100K to about 130K. This achieves a high density of cluster islands, preferably in which one island cluster nucleates within each network unit cell of the underlying texturizing layer.

Besides the described Ag cluster arrays, the conductive layer 40" can comprise, for example, cobalt (Co) clusters on a texturizing layer 38" formed by annealing monolayers of copper (Cu) deposited on a platinum (Pt) underlayer, among other metal combinations.

The relief pattern of the texturizing layer 38" functions as a "seed" layer for the depositing metal conductive overlayer 40". However, unlike current HSG formation, the "seeding" is not random and the cluster arrangement of the metal overlayer 40" is more precisely ordered.

Figure 3E:
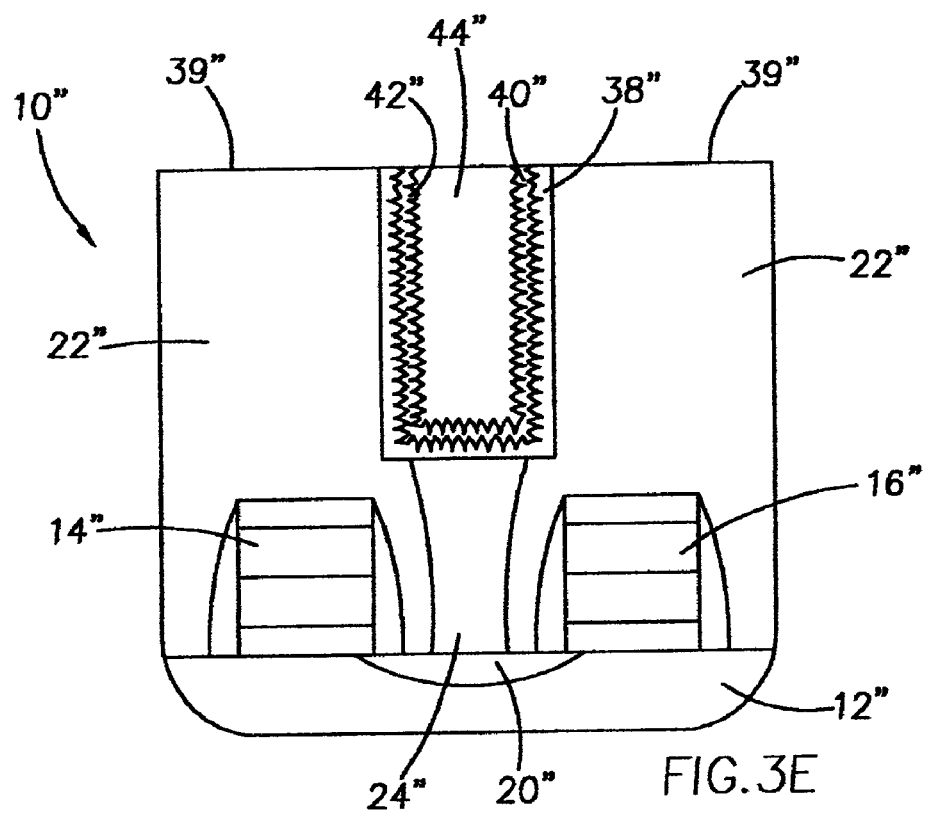
Figure 3F:
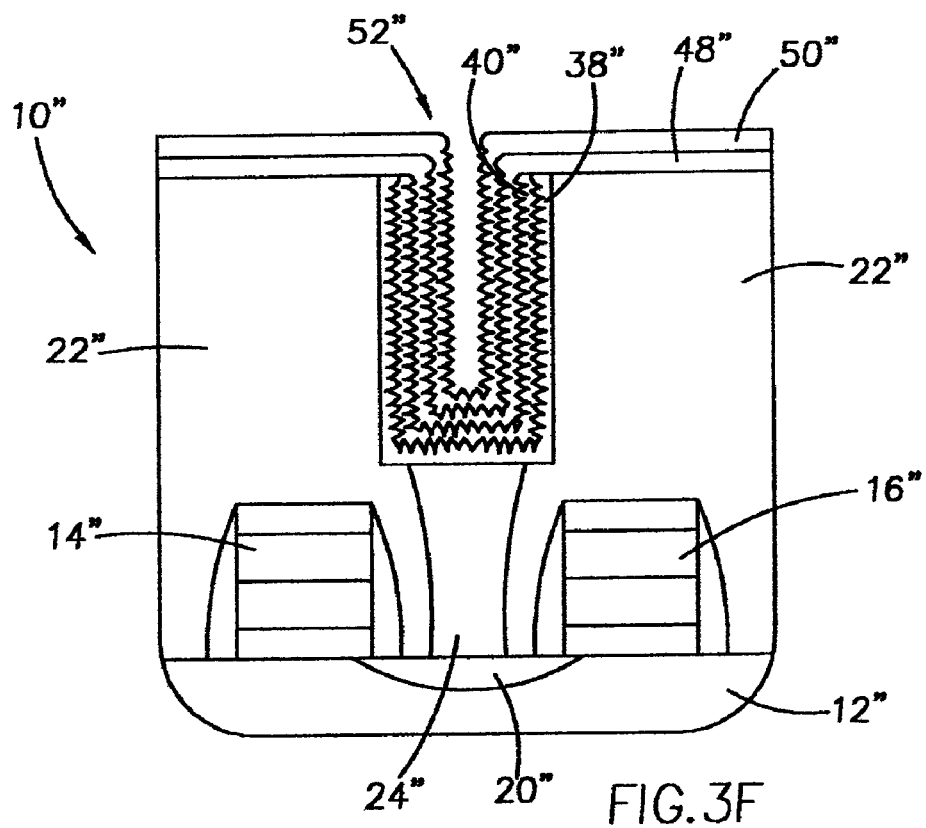

Once the lower electrode 42" is formed, subsequent process steps are performed using techniques well known to one skilled in the art to complete the capacitor. Referring to FIG. 3E, the container 26" is filled with a barrier (resist) layer 44" and the conductive metal layer 40" is removed from horizontal surfaces 39" of the insulative layer 22", for example, by CMP. Then, as depicted in FIG. 3F, the barrier layer 44" is removed from the container 26", and a clean process designed to remove native oxide from the surface of the lower (bottom) electrode 42", such as an HF clean, is performed. A thin dielectric layer (e.g., $Ta_2O_5$) 48" is conformally deposited over the lower electrode 42", and a conductive material (e.g., conductive metal) is deposited to form the top electrode 50" to complete the capacitor structure 52". The top electrode can also comprise polysilicon resulting in a hybrid metal/insulator/silicon capacitor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor, comprising:
    a lower capacitor electrode comprising a conductive material overlying a continuous texturizing layer, the texturizing layer comprising an annealed layer of at least two metals and not HSG silicon, the texturizing layer having surface dislocations in a periodic network of metal nanostructures having substantially uniform dimensions, and the conductive material comprising metal clusters on the surface dislocations of the texturizing layer;
    a dielectric layer overlying the lower capacitor electrode; and
    an upper capacitor electrode overlying the dielectric layer.

2. The capacitor of claim 1, wherein the texturizing layer comprises platinum and at least one of silver and copper.

3. The capacitor of claim 2, wherein the periodic network of nanostructures comprises a strain relief pattern.

4. The capacitor of claim 3, wherein the periodic network of nanostructures comprises a trigonal dislocation network of unit cells.

5. The capacitor of claim 1, integrated into a DRAM cell.

6. A semiconductor circuit, comprising a capacitor comprising a lower electrode comprising a conductive material overlying a texturizing layer comprising a continuous annealed layer of at least two metals and not HSG silicon, the texturizing layer having a surface comprising dislocations in a periodic network of metal nanostructures and the conductive material comprising metal clusters on the surface dislocations of the texturing layer, a dielectric layer overlying the lower capacitor electrode, and an upper electrode overlying the dielectric layer.

7. An integrated circuit, comprising a capacitor comprising a lower electrode comprising a conductive material overlying a texturizing layer comprising a continuous annealed layer of at least two metals and not HSG silicon, the texturizing layer having a surface comprising dislocations in a periodic network of metal nanostructures and the conductive material comprising metal clusters on the surface dislocations of the texturing layer, a dielectric layer overlying the lower capacitor electrode, and an upper electrode overlying the dielectric layer.

8. The integrated circuit of claim 7, further comprising:
    an array of memory cells; and
    internal circuitry;
    wherein the capacitor is within an opening in an insulative layer over a substrate and in electrical contact with an active area within the substrate.

9. A capacitor, comprising:
    a lower capacitor plate comprising a conductive material overlying a texturizing layer; the texturizing layer comprising surface dislocations comprising an annealed conductive metal layer of at least two metals, and the overlying conductive material comprising clusters of a conductive metal on the surface dislocations of the texturizing layer, the lower capacitor plate not comprising HSG silicon;

a dielectric layer overlying the lower capacitor plate; and an upper capacitor plate overlying the dielectric layer.

10. The capacitor of claim 9, wherein the texturizing layer comprises an annealed layer of platinum and silver.

11. The capacitor of claim 9, wherein the texturizing layer comprises an annealed layer of platinum and silver, and the overlying conductive material comprises silver.

12. The capacitor of claim 9, wherein the texturizing layer comprises an annealed layer of platinum and copper, and the overlying conductive material comprises cobalt.

13. The capacitor of claim 9, wherein the upper capacitor plate comprises a doped polysilicon.

14. The capacitor of claim 9, wherein the upper capacitor plate comprises a conductive metal.

15. The capacitor of claim 9, wherein the capacitor is integrated into a DRAM cell.

16. A capacitor, comprising:

a lower capacitor plate comprising a conductive layer overlying a texturizing layer; the texturizing layer comprising an annealed layer of a first and second conductive metal comprising surface dislocations, and the conductive layer comprising island clusters of a third conductive metal on the surface dislocations of the texturizing layer;

a dielectric layer overlying the lower capacitor plate; and an upper capacitor plate overlying the dielectric layer.

17. A capacitor, comprising a lower electrode comprising a conductive material overlying a texturizing layer comprising a continuous annealed metal layer of at least two metals with surface dislocations in a periodic array, the conductive material comprising metal clusters on the surface dislocations of the texturizing layer, and the lower electrode not comprising HSG silicon.

18. The capacitor of claim 17, wherein the periodic array of surface dislocations comprises nanostructures in a strain relief pattern.

* * * * *

UNITED STATES PATENT AND TRADEMARK OFFICE
CERTIFICATE OF CORRECTION

PATENT NO. : 7,573,121 B2 Page 1 of 1
APPLICATION NO. : 11/514694
DATED : August 11, 2009
INVENTOR(S) : Donald L Yates et al.

It is certified that error appears in the above-identified patent and that said Letters Patent is hereby corrected as shown below:

In column 12, line 14, in Claim 17, after "annealed" delete "metal".

Signed and Sealed this

Thirteenth Day of October, 2009

David J. Kappos
*Director of the United States Patent and Trademark Office*